(12) United States Patent
Shen et al.

(10) Patent No.: US 12,245,414 B2
(45) Date of Patent: Mar. 4, 2025

(54) METHOD OF ETCHING A MEMORY STACK BY ETCHING A BLIND HOLE

(71) Applicant: CHANGXIN MEMORY TECHNOLOGIES, INC., Hefei (CN)

(72) Inventors: Runsheng Shen, Hefei (CN); Xifei Bao, Hefei (CN); Changli Zhu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 416 days.

(21) Appl. No.: 17/653,428

(22) Filed: Mar. 3, 2022

(65) Prior Publication Data
US 2022/0302117 A1  Sep. 22, 2022

Related U.S. Application Data

(63) Continuation of application No. PCT/CN2021/120084, filed on Sep. 24, 2021.

(30) Foreign Application Priority Data

Mar. 18, 2021 (CN) .......................... 202110291475.0

(51) Int. Cl.
*H01L 27/108* (2006.01)
*H10B 12/00* (2023.01)

(52) U.S. Cl.
CPC .................... *H10B 12/03* (2023.02)

(58) Field of Classification Search
CPC .................................................. H10B 12/03
See application file for complete search history.

(56) References Cited

U.S. PATENT DOCUMENTS

| 10,304,744 | B1 | 5/2019 | Joseph et al. |
| 10,943,908 | B2* | 3/2021 | Bae .......................... H01L 28/90 |
| 11,107,726 | B2 | 8/2021 | Xie et al. |
| (Continued) | | | |

FOREIGN PATENT DOCUMENTS

| CN | 101211782 A | 7/2008 |
| CN | 105448841 A | 3/2016 |
| (Continued) | | |

OTHER PUBLICATIONS

International Search Report cited in PCT/CN2021/120084 mailed Dec. 22, 2021, 9 pages.

(Continued)

*Primary Examiner* — Peter Bradford
(74) *Attorney, Agent, or Firm* — Syncoda LLC; Feng Ma (57) ABSTRACT

The present disclosure provides a manufacturing method of a semiconductor device, including: providing a substrate; forming a film stack structure on the substrate, a top of the film stack structure being a cover layer; forming a mask structure on the cover layer, the mask structure including a mask layer and a pattern transfer layer sequentially stacked from top to bottom; performing a first etching on the mask structure to form first blind holes, the first blind holes running through the mask structure and terminating in the cover layer; and performing a second etching on the mask structure, and removing the mask layer, to flatten a top surface of the pattern transfer layer and trim bottoms of the first blind holes.

18 Claims, 7 Drawing Sheets

(56) References Cited

U.S. PATENT DOCUMENTS

| | | | |
|---|---|---|---|
| 2011/0006284 A1* | 1/2011 | Cho | G02B 6/1225 |
| | | | 257/14 |
| 2011/0129991 A1* | 6/2011 | Armstrong | H01L 21/3088 |
| | | | 430/323 |
| 2011/0174770 A1 | 7/2011 | Hautala | |
| 2020/0035505 A1* | 1/2020 | Jiang | H01L 21/0228 |
| 2020/0098763 A1* | 3/2020 | Bae | H01L 21/31144 |
| 2020/0176468 A1* | 6/2020 | Herner | H10B 43/50 |
| 2020/0350168 A1* | 11/2020 | Kim | H01L 21/02554 |
| 2021/0047733 A1* | 2/2021 | Qi | H10B 12/02 |

FOREIGN PATENT DOCUMENTS

| | | | | | |
|---|---|---|---|---|---|
| CN | 208298827 | U | | 12/2018 | |
| CN | 109545790 | A | | 3/2019 | |
| CN | 110323181 | A | | 10/2019 | |
| CN | 110634733 | A | | 12/2019 | |
| CN | 110739212 | A | | 1/2020 | |
| CN | 110943085 | A | * | 3/2020 | ......... H01L 21/0337 |
| CN | 111863826 | A | | 10/2020 | |
| CN | 112408314 | A | | 2/2021 | |
| CN | 113066761 | A | | 7/2021 | |
| CN | 111564448 | B | * | 9/2021 | .......... H01L 27/1157 |
| CN | 115241201 | A | * | 10/2022 | |

OTHER PUBLICATIONS

First Office Action and English Translation cited in CN202110291475.0 mailed Mar. 18, 2022, 17 pages.

* cited by examiner

METHOD OF ETCHING A MEMORY STACK BY ETCHING A BLIND HOLE

CROSS-REFERENCE TO RELATED APPLICATIONS

The present disclosure is a continuation application of International Patent Application No. PCT/CN2021/120084, titled "MANUFACTURING METHOD OF SEMICONDUCTOR DEVICE" and filed on Sep. 24, 2021, which claims the priority to Chinese Patent Application No. 202110291475.0, titled "MANUFACTURING METHOD OF SEMICONDUCTOR DEVICE" and filed on Mar. 18, 2021. The entire contents of International Patent Application No. PCT/CN2021/120084 and Chinese Patent Application No. 202110291475.0 are incorporated herein by reference.

TECHNICAL FIELD

The present disclosure relates to, but is not limited to, a manufacturing method of a semiconductor device.

BACKGROUND

A dynamic random access memory (DRAM) is a type of volatile memory, which is an indispensable key component in many electronic products. The DRAM includes a huge quantity of memory cells aggregated to form an array region for storing data. Each memory cell may include a metal oxide semiconductor (MOS) transistor and a capacitor connected in series.

At present, as the key size of the memory decreases continuously, the high aspect ratio of the capacitor holes of the memory is also continuously improved. However, the capacitor holes formed through the process in the related art have poor contours, affecting the memory yield.

SUMMARY

Embodiments of the present disclosure provide a manufacturing method of a semiconductor device, including: providing a substrate; forming a film stack structure on the substrate, a top of the film stack structure being a cover layer; forming a mask structure on the cover layer, the mask structure including a mask layer and a pattern transfer layer sequentially stacked from top to bottom; performing a first etching on the mask structure to form first blind holes, the first blind holes running through the mask structure and terminating in the cover layer; and performing a second etching on the mask structure, and removing the mask layer, to flatten a top surface of the pattern transfer layer and trim bottoms of the first blind holes.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are part rather than all of the embodiments of the present disclosure. Those skilled in the art may derive other drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
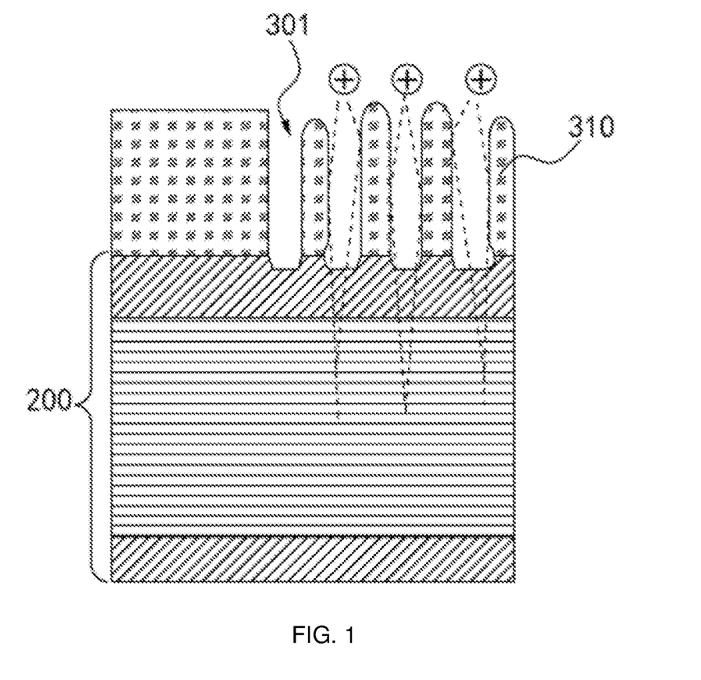
FIG. 1 and FIG. 2 are cross-sectional views of different process stages of forming capacitor holes in the related art.
Figure 2:
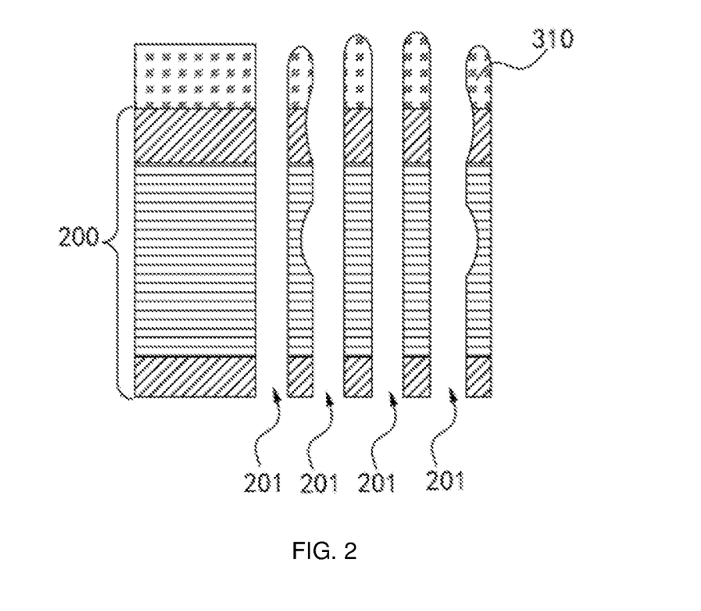

FIG. 1 and FIG. 2 are cross-sectional views of different process stages of forming capacitor holes in the related art. A semiconductor device in the related art includes a film stack structure 200 and a pattern transfer layer 310 formed on a surface of the film stack structure 200. Forming second blind holes 201 in the film stack structure 200 in the related art includes: performing a first etching to form first blind holes 301 in the pattern transfer layer 310, the first blind holes 301 running through the pattern transfer layer 310 and terminating on the surface of the film stack structure 200. After the first blind holes 301 are formed, a second etching is performed directly to form the second blind holes 201 in the film stack structure 200, the second blind holes 201 running through the film stack structure 200.

The problem of the process in the related art is that in the process of performing the first etching to form the first blind holes 301, the surface of the pattern transfer layer 310 is uneven, leading to asymmetric sputtering of the plasma. As a result, the contours of the bottoms of the first blind holes 301 are sharp and inclined to a certain degree instead of being vertical and uniform. In this way, when the second etching is performed, the uneven contours of the first blind holes 301 result in uneven contours of the formed second blind holes 201 (as shown in FIG. 2). Consequently, the capacitor structures formed in the second blind holes 201 are subject to a short circuit or collapse, decreasing the yield.

In the manufacturing method of a semiconductor device provided in the embodiments of this present disclosure, after the first etching is performed to form the first blind holes 301 and before the second etching is performed to form the second blind holes 201, quick etching is performed to flatten a top surface of the pattern transfer layer 310 and trim bottoms of the first blind holes 301, so that the flattened pattern transfer layer 310 and the trimmed first blind holes 301 are etched continuously to obtain capacitor holes with vertical and uniform contours, improving the yield.

The manufacturing method of a semiconductor device according to the embodiments of this present disclosure includes the following steps: providing the substrate 100; forming the film stack structure 200 on the substrate 100, the top of the film stack structure 200 being a cover layer 250; forming a mask structure 300 on the cover layer 250, the mask structure 300 including a mask layer 320 and the pattern transfer layer 310 sequentially stacked from top to bottom; performing a first etching on the mask structure 300 to form the first blind holes 301, the first blind holes 301 running through the mask structure 300 and terminating in the cover layer 250; and performing a second etching on the mask structure 300, and removing the mask layer 320, to flatten the top surface of the pattern transfer layer 310 and trim the bottoms of the first blind holes 301.

In the manufacturing method of a semiconductor device according to the embodiments of this present disclosure, after the first etching is performed to form the first blind holes 301, the second etching is performed on the mask structure 300 to remove the mask layer 320, so that the pattern transfer layer 310 with a flat top surface and the first blind holes 301 with relatively wide and flat bottom contours are obtained. In this way, in the next step of etching, because the contours of the pattern transfer layer 310 and the first blind holes 301 are both relatively regular, capacitor holes with relatively regular contours, that is, capacitor holes with a relatively uniform depth, aperture size, thickness between holes as well as relatively vertical hole walls, are obtained, and capacitor structures with preferable product performance are finally obtained.

With reference to FIG. 3 to FIG. 9, process stages of the manufacturing method of a semiconductor device are described below in detail according to the embodiments of the present disclosure.

Figure 3:
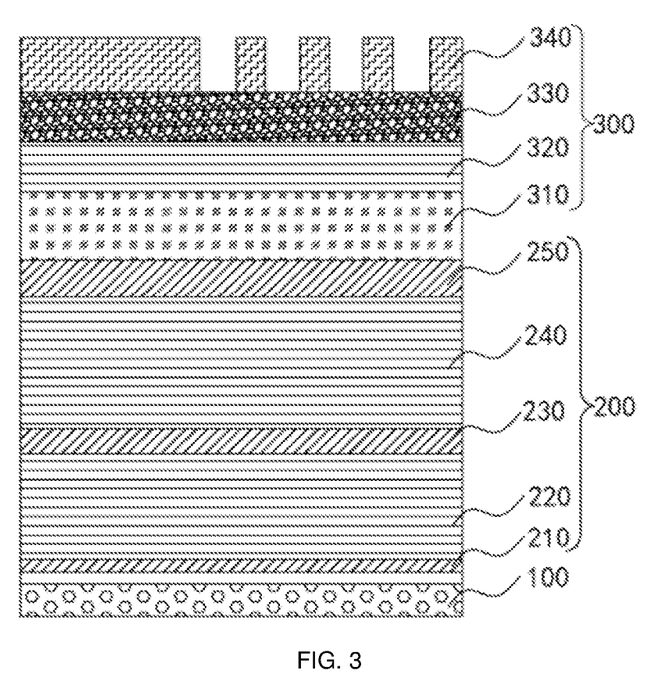
FIG. 3 to FIG. 9 are cross-sectional views of different process stages of a manufacturing method of a semiconductor device according to embodiments of the present disclosure, where

As shown in FIG. 3, the substrate 100 is provided, and the film stack structure 200 and the mask structure 300 are formed sequentially from bottom to top on the substrate 100. The mask structure 300 has a capacitor pattern. The capacitor pattern can be transferred to the film stack structure 200 by using an etching process, to form the capacitor structures in the film stack structure 200.

In an implementation, the substrate 100 in this embodiment may include a plurality of active regions, although which is not shown in the figure. For example, a shallow trench isolation region may be formed in the substrate 100 to define the plurality of active regions in the substrate 100. In some implementations, the shallow trench isolation region may include a single layer or a plurality of layers of suitable insulating materials such as silicon nitride, silicon oxynitride, and silicon carbide nitride.

In an implementation, the substrate 100 may include a silicon substrate, an epitaxial silicon substrate, a silicon germanium substrate, a silicon carbide substrate, or a silicon-on-insulator (SOI) substrate, but is not limited thereto.

A plurality of word line structures may be formed in the substrate 100, although which is not shown in the figure. In an implementation, the word line structures may be buried word lines, but are not limited thereto. Each word line structure may include a word line dielectric layer, a word line, and a word line cover layer, but is not limited thereto.

In an implementation, to form the word line structure, a plurality of trenches may be formed in the substrate 100, and then the word line dielectric layer, the word line, and the word line cover layer may be formed sequentially in the trenches, but the formation of the word line structure is not limited thereto. In some embodiments, other types of word line structures may also be formed as needed. In addition, the word line dielectric layer may include silicon oxide or other suitable dielectric materials. The word line may include aluminum, tungsten, copper, titanium aluminum alloy or other suitable conductive materials. The word line cover layer may include silicon nitride, silicon oxynitride, nitrogen silicon carbide or other suitable insulating materials.

In the implementation of the present disclosure, the mask structure 300 may include the pattern transfer layer 310, the mask layer 320, a hard mask layer 330, and a photoresist layer 340 sequentially from bottom to top.

Figure 4:
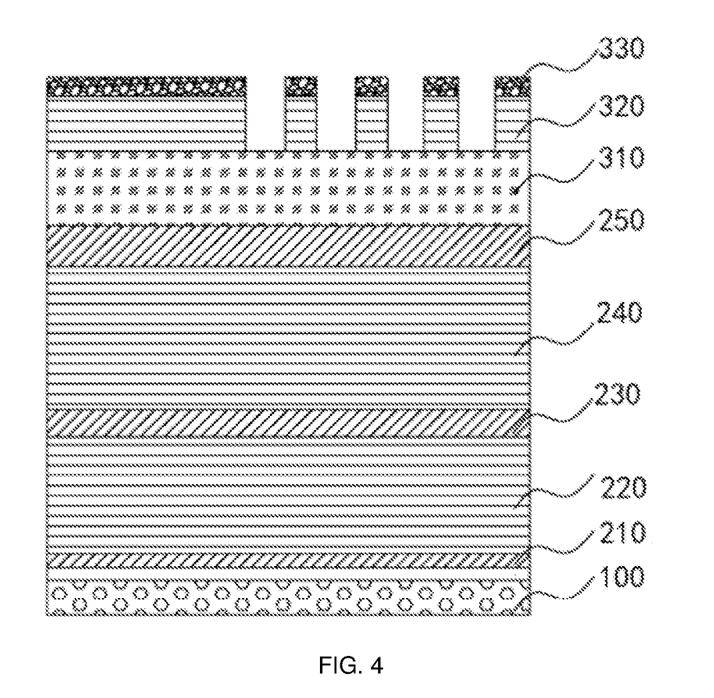

As shown in FIG. 3 and FIG. 4, the capacitor holes are formed in the photoresist layer 340, and the capacitor pattern is transferred to the mask layer 320 through an etching process. In the process of transferring the capacitor pattern to the mask layer 320, a part of the hard mask layer is removed, and the rest part of the hard mask layer remains.

Figure 5:
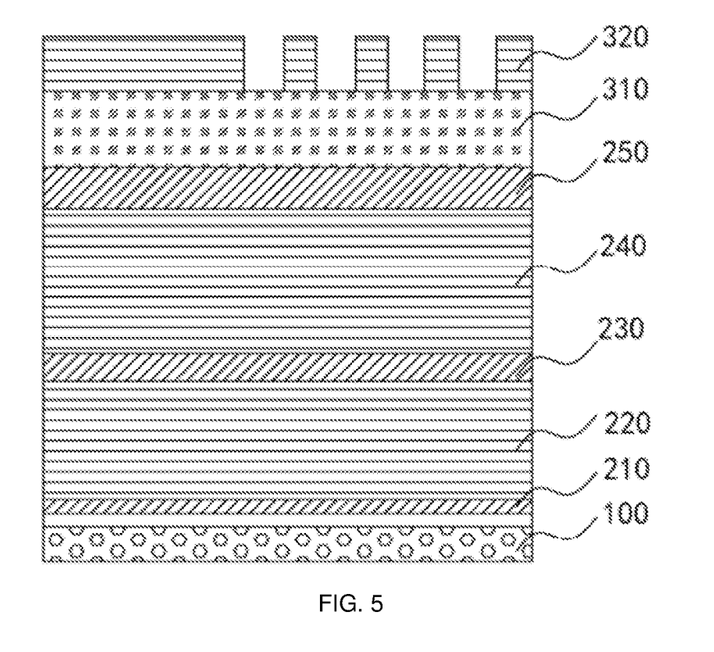

As shown in FIG. 5, the rest part of the hard mask layer is removed. In an implementation, the remaining hard mask layer may be removed through a chemical mechanical polishing process, a grinding process, an etching process, a dry polishing process, a wet cleaning process, one or more other suitable processes, or a combination of the foregoing.

Figure 6:
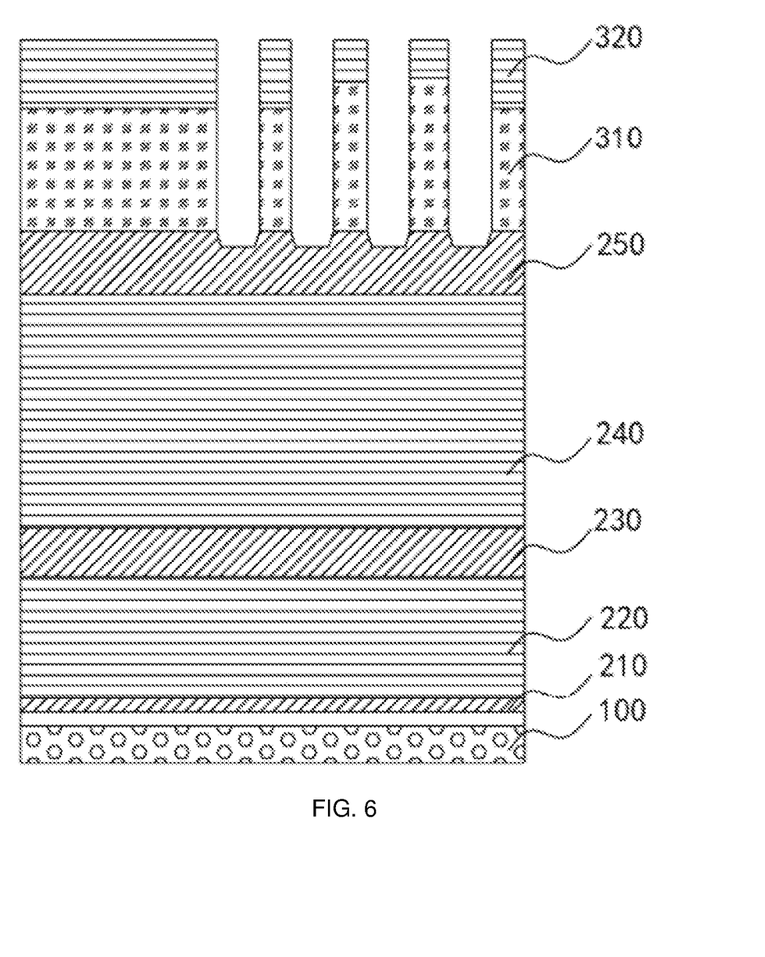

As shown in FIG. 6, the capacitor pattern defined by the mask layer 320 is transferred to the pattern transfer layer 310 through the etching process, and the capacitor pattern runs through the pattern transfer layer 310 and terminates on the surface of the film stack structure 200. In other words, the first blind holes 301 are formed in the mask structure 300, and the first blind holes 301 run through the mask structure 300 and terminate on the surface of the film stack structure 200.

In an implementation, a material of the mask layer 320 may include silicon oxide. A material of the pattern transfer layer 310 includes polysilicon. A material of the cover layer 250 in the film stack structure 200 includes silicon nitride.

In this embodiment, the material of the mask layer 320 is silicon oxide. The material of the pattern transfer layer 310 is polysilicon. Because an etch selectivity ratio of silicon oxide to polysilicon is relatively high, and the hardness of polysilicon is relatively high, polysilicon is used as the material of the pattern transfer layer 310, so that the shape retention of the pattern transfer layer 310 is better, and the subsequent formation of capacitor holes with proper contours is ensured.

In some implementations, a deposition material of a polysilicon layer may be silane or disilane, and may also be doped with one or more elements of boron, arsenic, phosphorus, or germanium.

In an implementation, the hard mask layer 330 in the embodiments of the present disclosure includes an anti-reflection coating and an amorphous carbon layer. The anti-reflection coating can reduce the interference of reflected light during exposure. The amorphous carbon layer is formed on the surface of the mask layer 320 and serves as a mask for the mask layer 320 to prevent abrasion at the corners of sidewalls of the holes of the mask layer 320 by an etching gas during the etching.

In an implementation, the material of the anti-reflection coating may include silicon oxynitride, spin-on-carbon, or other carbon-containing organic materials.

Figure 7:
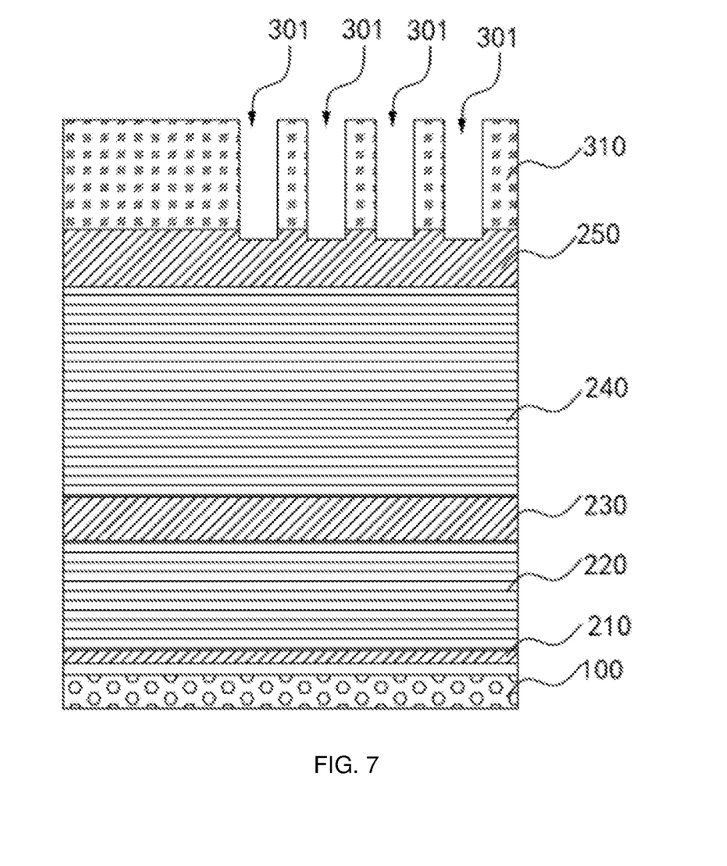

As shown in FIG. 7, after the first etching is performed to form the first blind holes 301 in the mask structure 300, the second etching is performed, and the mask layer 320 is removed, to flatten the top surface of the pattern transfer layer 310, and trim the bottoms of the first blind holes 301.

For example, during the second etching, by using the high etch selectivity ratio of the mask layer 320 and the cover layer 250, the bottoms of the first blind holes 301 can be trimmed while the mask layer 320 is removed. Finally, the pattern transfer layer 310 with a relatively flat top surface and the first blind holes 301 with relatively wide and flat bottom contours and relatively vertical hole wall contours are obtained.

In an implementation, an etch selectivity ratio of the mask layer 320 to the cover layer 250 during the second etching may be 10:1-20:1.

In an implementation, the material of the mask layer 320 may be silicon oxide. The material of the cover layer 250 may be silicon nitride.

In an implementation, during the second etching on the mask structure 300, a plasma source power may be 12,000-22,000 W, and a radio frequency may be 400 kHz.

During the second etching on the mask structure 300, a bias power is 4,100-5,700 W, and a radio frequency is 400 MHz.

During the second etching on the mask structure 300, a chamber pressure is 10-30 mTorr.

During the second etching on the mask structure 300, an etching time is 10-30 s, to avoid excessive consumption of the pattern transfer layer 310, otherwise, the patterns of the first blind holes 301 are damaged.

In an implementation, etching gases during the second etching may include $C_4F_8$, $C_4F_6$, and $O_2$, and flow rates thereof are: 15-45 sccm, 20-50 sccm, and 40-65 sccm respectively. The selection of the etching gases and flow rates makes an etch selectivity ratio of the pattern transfer layer 310 to the mask layer 320 and that of the cover layer 250 to the mask layer 320 relatively small during the second etching, thereby optimizing the modification effect of the second etching and avoiding excessive consumption the pattern transfer layer 310.

Figure 8:
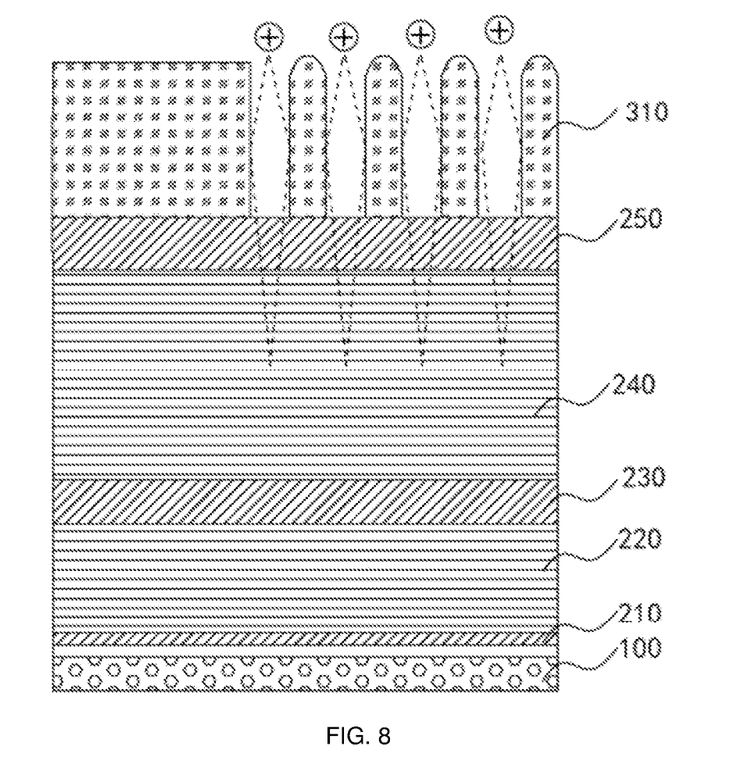
Figure 9:
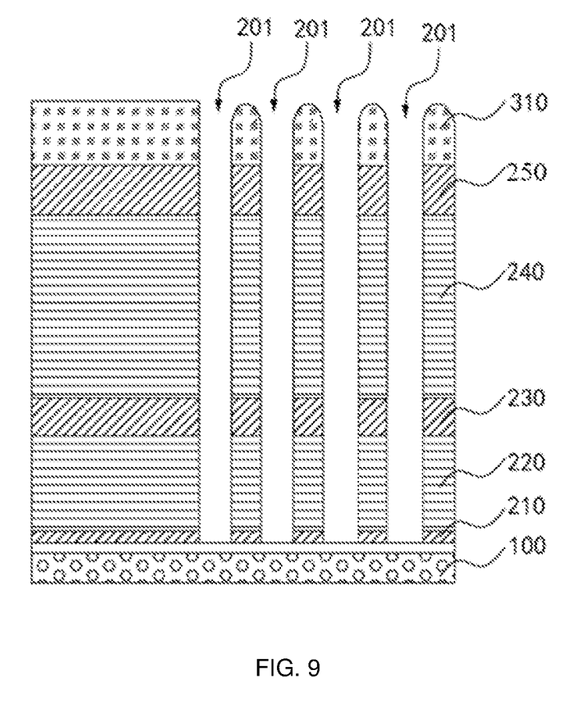

As shown in FIG. 8 and FIG. 9, the manufacturing method of a semiconductor device according to the embodiments of the present disclosure further includes:

performing a third etching on the film stack structure 200 downwards along the first blind holes 301 to form second blind holes 201 in the film stack structure 200, the second blind holes 201 running through the film stack structure 200 and terminating on a surface of the substrate 100.

Because during the second etching the top surface of the pattern transfer layer 310 is flattened, and the bottoms of the first blind holes 301 are trimmed, during the third etching downwards along the first blind holes 301, the second blind holes 201 with vertical and uniform contours can be obtained. Compared with the capacitor holes with irregular contours in the related art, the capacitor structures formed in the second blind holes 201 in the present disclosure have better performance and are less subject to a short circuit or collapse.

In an implementation, the substrate 100 further includes a contact pad, and bottoms of the second blind holes 201 expose the contact pad.

In an implementation, a material of the contact pad includes tungsten.

In an implementation of the present disclosure, after the second blind holes 201 are formed in the film stack structure 200, the method further includes: removing the pattern transfer layer 310; and forming capacitor structures in the second blind holes 201.

As shown in FIG. 3, the film stack structure 200 may include the cover layer 250, a second sacrificial layer 240, an intermediate layer 230, a first sacrificial layer 220, and a bottom layer 210 sequentially stacked from top to bottom. The materials of the cover layer 250, the intermediate layer 230, and the bottom layer 210 may include silicon nitride. The materials of the first sacrificial layer 220 and the second sacrificial layer 240 may include, but are not limited to silicon oxide, phospho-silicate glass, boro-phospho-silicate glass, and the like. The materials of the first sacrificial layer 220 and the second sacrificial layer 240 may be same or different.

The forming capacitor structures in the second blind holes 201 includes: forming a first electrode layer, the first electrode layer covering bottom and sidewalls of the second blind holes 201; removing the first sacrificial layer 220 and the second sacrificial layer 240, and retaining the cover layer 250, the intermediate layer 230, and the bottom layer 210; and forming a capacitor dielectric layer, the capacitor dielectric layer covering the first electrode layer; and forming a second electrode layer, the second electrode layer covering the capacitor dielectric layer.

In an implementation, the materials of the first electrode layer and the second electrode layer may be one or more of titanium, titanium nitride, and tungsten. The materials of the first electrode layer and the second electrode layer may be same or different.

In an implementation, the material of the capacitor dielectric layer may be one or more of aluminum oxide, silicon nitride, silicon oxide, and zirconium oxide.

In an implementation, the removing the first sacrificial layer 220 and the second sacrificial layer 240, and the retaining the cover layer 250, the intermediate layer 230, and the bottom layer 210 include: forming a first opening on the cover layer 250, the first opening exposing the first sacrificial layer 220; removing the first sacrificial layer 220 through the first opening by using a wet etching process; forming a second opening on the intermediate layer 230, the second opening exposing the second sacrificial layer 240; and removing the second sacrificial layer 240 through the second opening by using the wet etching process.

In an implementation, the chemical solution in the wet etching process used to remove the first sacrificial layer 220 and the second sacrificial layer 240 may include, but is not limited to diluted hydrofluoric acid (DHF) or a mixture of hydrofluoric acid (HF) and ammonia fluoride ($NH_4F$).

In an implementation, to form the first opening on the cover layer 250 and form the second opening on the intermediate layer 230, a part of the upper surface of the cover layer 250 or the intermediate layer 230 may be exposed and developed by using a lithography technique, and then etched by using a chemical gas such as $C_4F_6$, $SF_6$, $Cl_2$, and $BCl_3$.

In an implementation, in the process of forming the second blind holes 201 in the film stack structure 200, an etch selectivity ratio of second sacrificial layer 240 to the cover layer 250 may be 1:1-4:1.

Certainly, it may be understood that the film stack structure 200 may also only include the cover layer 250, the sacrificial layer, and the bottom layer 210 from top to bottom. If the film stack structure 200 is used, the forming capacitor structures in the second blind holes 201 may include: forming the first electrode layer, the first electrode layer covering the bottom and sidewalls of the second blind holes 201; removing the sacrificial layer, and retaining the cover layer 250 and the bottom layer 210; forming the capacitor dielectric layer, the capacitor dielectric layer covering the first electrode layer; and forming the second electrode layer, the second electrode layer covering the capacitor dielectric layer.

In an implementation, the materials of the cover layer 250 and the bottom layer 210 may include silicon nitride. The material of the sacrificial layer may include, but is not limited to silicon oxide, phospho-silicate glass, boro-phospho-silicate glass, and the like.

In an implementation, the materials of the first electrode layer and the second electrode layer may be one or more of titanium, titanium nitride, and tungsten. The materials of the first electrode layer and the second electrode layer may be same or different.

In an implementation, the material of the capacitor dielectric layer may be one or more of aluminum oxide, silicon nitride, silicon oxide, and zirconium oxide.

In an implementation, the removing the sacrificial layer, and the retaining the cover layer 250 and the bottom layer 210 may include: forming the first opening on the cover layer 250, the first opening exposing the sacrificial layer; and removing the sacrificial layer through the first opening by using the wet etching process.

In an implementation, the chemical solution in the wet etching process used to remove the sacrificial layer may include, but is not limited to DHF or a mixture of HF and $NH_4F$.

In an implementation, to form the first opening on the cover layer 250, a part of the upper surface of the cover layer 250 may be exposed and developed by using the lithography technique, and then etched by using a chemical gas such as $C_4F_6$, $SF_6$, $Cl_2$, and $BCl_3$.

In an implementation, in the process of forming the second blind holes 201 in the film stack structure 200, an etch selectivity ratio of the sacrificial layer to the cover layer 250 may be 1:1-4:1.

Based on the above, the manufacturing method of a semiconductor device according to the embodiments of the present disclosure have the following advantages and beneficial effects:

In the manufacturing method of a semiconductor device according to the embodiments of this present disclosure, after the first etching is performed to form the first blind holes 301, the second etching is performed on the mask structure 300 to remove the mask layer 320, so that the pattern transfer layer 310 with a relatively flat top surface and the first blind holes 301 with relatively wide and flat bottom contours are obtained. In this way, in the next step of etching, because the contours of the pattern transfer layer 310 and the first blind holes 301 are both relatively regular, capacitor holes with relatively regular contours are obtained, and capacitor structures with preferable product performance are finally obtained.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the manufacturing method of a semiconductor device provided in the embodiments of this present disclosure, after the first etching is performed to form the first blind holes, the second etching is performed on the mask structure to remove the mask layer, and the pattern transfer layer with a relatively flat top surface and the first blind holes with relatively wide and flat bottom contours are obtained. In this way, in the next step of etching, because the contours of the pattern transfer layer and the first blind holes are both relatively regular, capacitor holes with relatively regular contours are obtained, and capacitor structures with preferable product performance are finally obtained.

The invention claimed is:

1. A method of etching a memory stack by etching a blind hole, comprising:
   providing a substrate;
   forming a film stack structure on the substrate, a top of the film stack structure being a cover layer;
   forming a mask structure on the cover layer, the mask structure comprising a mask layer and a pattern transfer layer sequentially stacked from top to bottom;
   performing a first etching on the mask structure to form first blind holes, the first blind holes running through the mask structure and terminating in the cover layer; and
   performing a second etching on the mask structure to remove the mask layer, and to obtain a flatter top surface of the pattern transfer layer and wider bottom contours of the first blind holes than before the second etching.

2. The method according to claim 1, wherein an etch selectivity ratio of the mask layer to the cover layer during the second etching is 10:1-20:1, while a material of the mask layer including silicon oxide, and a material of the cover layer including silicon nitride.

3. The method according to claim 1, wherein the mask structure further comprises a photoresist layer and a hard mask layer;
the hard mask layer is formed on the mask layer; and
the photoresist layer is formed on the hard mask layer.

4. The method according to claim 3, wherein the hard mask layer comprises an anti-reflection coating and an amorphous carbon layer.

5. The method according to claim 4, wherein a material of the anti-reflection coating comprises silicon oxynitride or spin-on-carbon.

6. The method according to claim 1, wherein during the second etching on the mask structure, a plasma source power is 12,000-22,000 W, and a radio frequency is 400 KHz.

7. The method according to claim 1, wherein during the second etching on the mask structure, a bias power is 4,100-5,700 W, and a radio frequency is 400 MHz.

8. The method according to claim 1, wherein during the second etching on the mask structure, a chamber pressure is 10-30 mTorr.

9. The method according to claim 1, wherein during the second etching on the mask structure, a process time is 10-30 s.

10. The method according to claim 1, wherein during the second etching on the mask structure, flow rates of etching gases are $C_4F_8$: 15-45 sccm, $C_4F_6$: 20-50 sccm, and $O_2$: 40-65 sccm.

11. The method according to claim 1, wherein a material of the mask layer comprises silicon oxide, a material of the pattern transfer layer comprises polysilicon, and a material of the cover layer comprises silicon nitride.

12. The method according to claim 1, the method further comprises:
performing a third etching on the film stack structure downwards along the first blind holes to form second blind holes in the film stack structure, the second blind holes running through the film stack structure and terminating on a surface of the substrate.

13. The method according to claim 12, wherein the substrate further comprises a contact pad, and bottoms of the second blind holes expose the contact pad.

14. The method according to claim 13, wherein a material of the contact pad comprises tungsten.

15. The method according to claim 12, after the forming second blind holes in the film stack structure, the method further comprises:
removing the pattern transfer layer; and
forming capacitor structures in the second blind holes.

16. The method according to claim 15, wherein the film stack structure comprises the cover layer, one or more sacrificial layers, and a bottom layer sequentially stacked from top to bottom; and
the forming capacitor structures in the second blind holes comprises:
forming a first electrode layer on bottom and sidewalls of the second blind holes;
removing the one or more sacrificial layers;
forming a capacitor dielectric layer on a surface of the first electrode layer; and
forming a second electrode layer on the capacitor dielectric layer.

17. The method according to claim 16, wherein materials of the first electrode layer and the second electrode layer are same.

18. The method according to claim 16, wherein in the process of forming the second blind holes in the film stack structure, an etch selectivity ratio of the sacrificial layers to the cover layer is 1:1-4:1, while a material of the sacrificial layer including boro-phospho-silicate glass and a material of the cover layer including silicon nitride.

* * * * *